United States Patent [19]

Boehl et al.

[11] Patent Number: 5,654,708

[45] Date of Patent: Aug. 5, 1997

[54] PROCESS FOR COMPENSATING COMPONENT TOLERANCES IN ANALOG-DIGITAL CONVERTERS

[75] Inventors: Eberhard Boehl, Reutlingen; Arnd Gangei, Eningen; Wilfried Tenten, Gammertingen, all of Germany

[73] Assignee: Robert Bosch GmbH, Stuttgart, Germany

[21] Appl. No.: 535,119

[22] PCT Filed: Apr. 13, 1994

[86] PCT No.: PCT/DE94/00408

§ 371 Date: Oct. 26, 1995

§ 102(e) Date: Oct. 26, 1995

[87] PCT Pub. No.: WO94/26034

PCT Pub. Date: Nov. 10, 1994

[30] Foreign Application Priority Data

Apr. 27, 1993 [DE] Germany ............... 43 13 745.8

[51] Int. Cl.⁶ ................................................. H03M 1/10
[52] U.S. Cl. ............................................ 341/120; 341/172
[58] Field of Search ............................ 341/118, 120, 341/172

[56] References Cited

U.S. PATENT DOCUMENTS

| | | | |
|---|---|---|---|
| 4,709,225 | 11/1987 | Welland et al. | 341/120 |
| 4,999,633 | 3/1991 | Draxelmayr | 341/120 |
| 5,027,116 | 6/1991 | Armstrong et al. | 341/120 |
| 5,214,430 | 5/1993 | Gulczynski | 341/120 |
| 5,235,335 | 8/1993 | Hester et al. | 341/172 |

*Primary Examiner*—Marc S. Hoff
*Attorney, Agent, or Firm*—Kenyon & Kenyon

[57] ABSTRACT

A method for the compensation of component tolerances of a number of similar components, in particular capacitors in analog-to-digital converters which are connected to a common line, and whose electric value is in each case halved from component to component, the component with the smallest value being present twice. In this method, a first potential is at first applied to at least one of the components and a second potential is applied to the remaining components with lower values. A comparator then checks whether on the common line the mid-potential between the two potentials is present. There is then applied to a correction component (which is in addition connected to the common line) a variable correction voltage which is adjusted until the comparator determines the mid-potential on the common line. The determined correction voltage is finally stored as a correction value. As a result, each of these components can be adjusted individually and tolerance errors can be equalized, individual recalibrations being possible in each case which interrupt the converter operation of the analog-to-digital converter only for a very brief period. The precision and linearity of an analog-to-digital converter which uses a capacitor array adjusted in this way are very high.

12 Claims, 2 Drawing Sheets

PROCESS FOR COMPENSATING COMPONENT TOLERANCES IN ANALOG-DIGITAL CONVERTERS

FIELD OF THE INVENTION

The invention relates to a method for the compensation of component tolerances of a number of similar components, such as capacitors, resistors, current sources and the like, in analog-to-digital converters.

BACKGROUND INFORMATION

The short-channel CMOS processes usually used during the production of analog-to-digital converters are optimized to high transistor component densities and high switching speeds. In particular in the area of ASIC design, however, the further processing of an item of analog input information increasingly requires high-resolution and also precise analog-to-digital converters. As a result of how the process is carried out, high-precision analog components, such as for example resistors and capacitors, are available only in very rare cases. Therefore, in order to achieve accuracies beyond the limit of 8 bits, an adjustment method has to be provided, the type of adjustment essentially determining the quality and reliability of the converter. Binary weighted capacitor arrays are often used in analog-to-digital converters. However, inaccuracies in the weighting ratio of the capacitances inevitably lead to faulty conversion results. These errors result in differential nonlinearities (DNL) which often exceed the specified framework. A 12-bit converter can for example be specified with a precision of ½ or ¼ LSB, it being possible that discrepancies in the capacitive array which controls the upper 8 bits lead to faults of a couple of 10 LSB.

The following printed publications:
(1) LEE H.S., Hodges D.A., "Self-Calibration Technique for A/D converter", IEEE CAS-30, pp. 188–190, March 1983
(2) Tsukada T., Takagi K., Kita Y., Nagata M., "An Automatic Error Cancellation Technique for Higher Accuracy A/D Converters", IEEE, Journal of Solid-State-Circuits, Vol. SC-19, No. 2, pp. 266–268, April 1984
(3) Matsuya Y., Akazawa Y., Iwata A., "High-Linearity and High-Speed CMOS 1-chip A/D, D/A Converter. All-Digital Linearity Error Correction (LECS)", Electronics and Communications in Japan, Part 2, Vol. 70, pp. 73–84, 1987
(4) McCreary J. L., Gray P. R., "A High-Speed, All-MOS Successive Approximation Weighted Capacitor A/D Conversion Technique" ISSCC Dig. Tech. Papers, pp. 38–39, February 1975
(5) McCreary J. L., Gray P. R., "All-MOS Charge Redistribution Analog-to-Digital Conversion Techniques-Part I", IEEE SC-10 pp. 371–379, December 1979 disclose correction methods for capacitance arrays in analog-to-digital converters, all of which use an additional digital-to-analog converter. In the case of known correction methods, the capacitor array is corrected in its entirety, but not the individual capacitances independently of the capacitance deviations of the others. Consequently, a recalibration is not possible during normal operation without a relatively long interruption of the conversion process.

European Patent Application No. 0 064 147 A3 describes an analog-to-digital converter in which a multiplicity of similar capacitors are used, where the capacitance values are in each case halved from component to component. The component with the smallest place value is present twice. By applying potentials, a predetermined component is compared with the remaining components of lower place value in that the potential which then appears at the capacitors is compared with a reference potential. In this process, all capacitors are compared with each other successively.

SUMMARY OF THE INVENTION

The compensation method according to the invention has the advantage that as a result of the individual corrections of the individual components, in particular capacitors, independently of the other components, a recalibration of each individual component is possible during normal operation, in each case only very short interruptions of the conversion process being required for this purpose. In addition, the individual compensation of tolerances of the individual components leads, on the whole, to a very precise analog-to-digital conversion over the entire range.

Particularly advantageous is the repetition of the method with interchanged first and second potential, the implementation of a mean-value formation of the two determined correction voltages and the storage of the mean value as the correction value. Possible inaccuracies of the mid-potential are automatically compensated thereby, with the result that the formation of the mid-potential can likewise be carried out relatively inaccurately and have no effect on the precision of the analog-to-digital conversion.

It is expedient for a correction value to be determined and stored in a corresponding manner for each component, preferably in digital form.

An advantageous design of the compensation adjustment by the comparator can be performed in that the correction voltage is formed as a changing signal sequence with a small voltage change and in that a corresponding output signal change at the comparator is evaluated as an adjustment which has been achieved. In order to achieve continuous recalibration during the normal operation of the analog-to-digital converter, a recalibration of the correction values is performed during operational interruptions of the analog-to-digital converter one after the other, at least one correction value being recalibrated during each operational interruption. Of course, it is also possible to recalibrate all correction values during a break in the work or an operational interruption or on demand.

In order to equalize significant differences of the newly determined correction values during the recalibration process, a smoothing method for attenuating these types of differences in the manner of a low-pass filter is advantageously provided. Large deviations which are possibly based on disturbances can be prevented thereby.

During proper operation of the analog-to-digital converter, the stored correction values are accordingly taken into account one after the other during each conversion step, so that each conversion step is carried out with the highest possible precision.

In order to achieve defined starting conditions, all the components which are designed as capacitors are discharged before the determination or recalibration of correction values. For this purpose, in particular both connections are connected to the mid-potential.

DETAILED DESCRIPTION OF THE DRAWINGS

Figure 1:
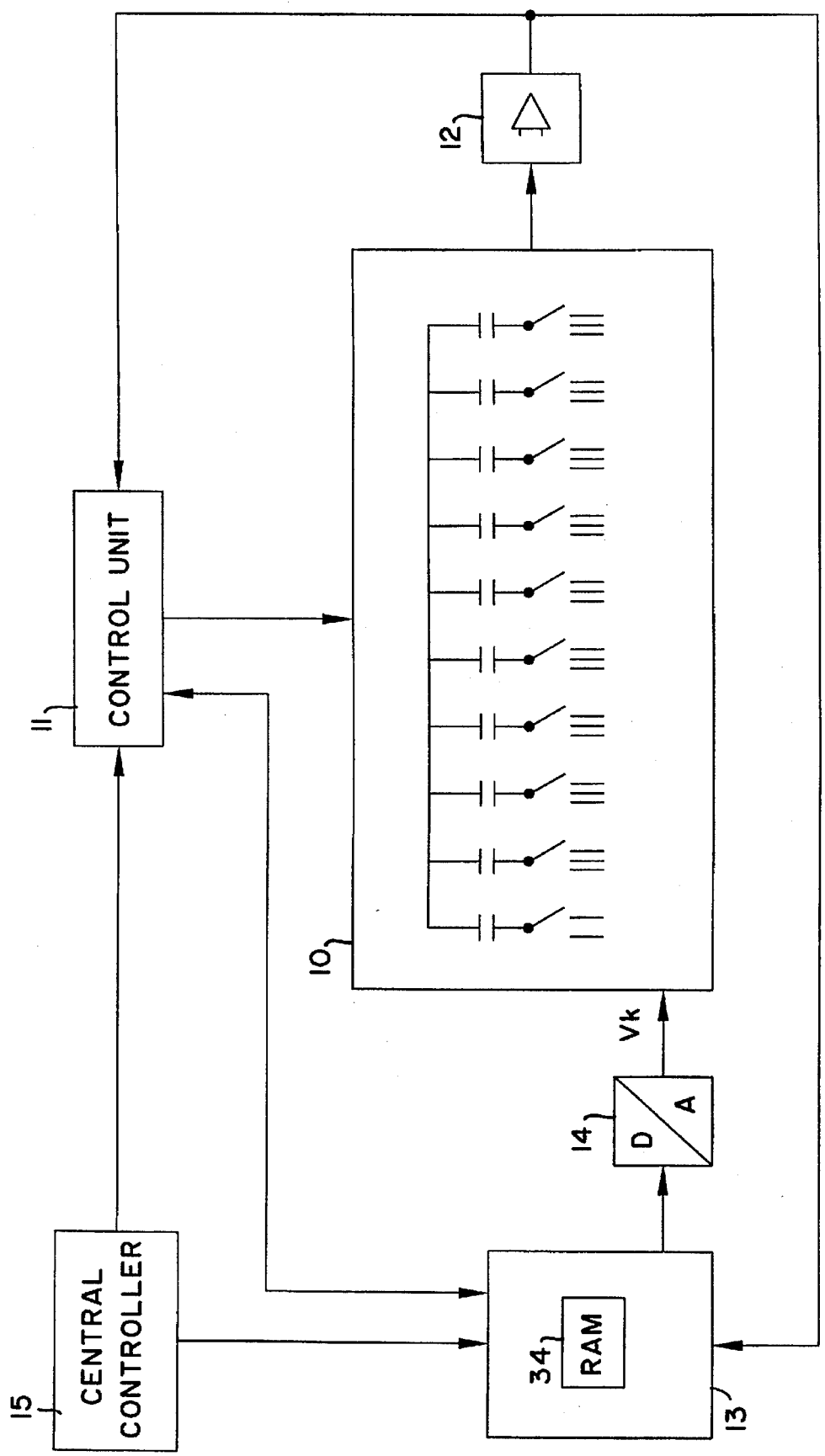
FIG. 1 shows a block diagram of an analog-to-digital converter with a compensation device according to the present invention.

In the analog-to-digital converter illustrated in FIG. 1, a capacitor array 10 provided with a multiplicity of switches is controlled by a control unit 11 (memory selection register and array driver). The capacitor array 10 has at the output side a comparator 12 which intervenes both in the control unit 11 and in a calibration and correction module 13, hereafter designated in a simplified way as module 13. This module 13 intervenes, via a correction digital-to-analog converter 14, in the capacitor array 10 and supplies in particular a correction voltage Vk, as will be explained in even more detail in the following text. This correction digital-to-analog converter 14 is hereafter designated in a simplified way as D/A converter 14. A central controller 15 which contains, in a manner not shown but known in the art, a clock decoder controlling the central functions of the control unit 11 and of the module 13. In addition, the control unit 11 and the module 13 influence each other.

Figure 2:
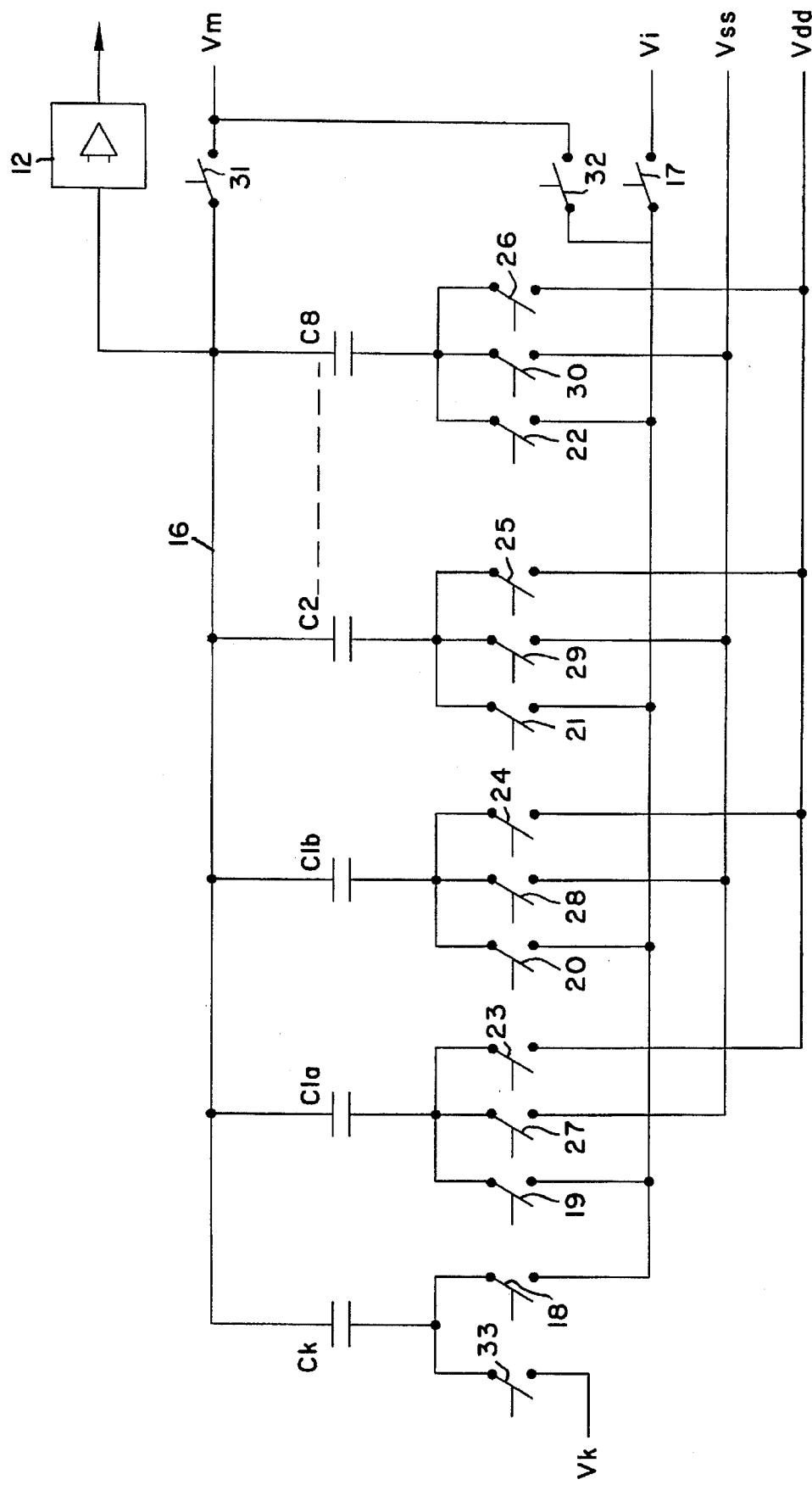
FIG. 2 shows a capacitor array in conjunction with required switches for carrying out the analog-to-digital conversion and the compensation process, according to the present invention.

In FIG. 2, the capacitor array 10 essentially comprising ten capacitors, to be specific a correction capacitor Ck and nine working capacitors C1a, C1b as well as C2 to C8. The capacitor C8 has the highest capacitance, in each case the following capacitor having a capacitance half as large as the next. The two capacitors C1a and C1b have identical capacitance values which represent the smallest capacitance values.

All capacitors are connected to a common center line 16 which is connected via the comparator 12 to the control unit 11 and to the module 13. For reasons of simplification, the capacitors C3 to C7 are not illustrated. The number of working capacitors determines the precision of the analog-to-digital converter, that is to say its bit resolution.

The analog input voltage Vi to be converted into digital values is fed via a controllable switch 17 to the capacitor array 10, this switch 17 being connected via further controllable switches 18–22 to all the capacitors (of course also to the capacitors C3 to C7, which are not illustrated, via further switches which are not illustrated). An upper voltage potential Vdd can be applied via further switches 23 to 26 to the working capacitors C1a to C8. Finally, another lower potential Vss can be applied via the switches 27 to 30 to the working capacitors C1a to C8. A mid-potential Vm which represents a mean value between the potentials Vdd and Vss can be applied, via a further switch 31, to the center line 16 and, via a further switch 32, to the line to which the analog input voltage Vi is fed (via the switch 17). The correction voltage Vk can be fed to the correction capacitor Ck via a switch 33. Instead of the arrangement illustrated, the mid voltage Vm can also be fed to this correction capacitor Ck separately via the switch 18, thus a mid voltage which is produced independently of the mid voltage which can be applied to the center line 16. In practice, connection of an independent mid voltage is often realized using this alternate arrangement.

With the exception of the compensation of component tolerance, which is still to be explained, the mode of operation of this type of analog-to-digital converter is known from the prior art and will therefore be discussed only briefly. At first, the input voltage Vi is applied to all working capacitors C1a to C8 by closing the switches 17, 19 to 22, while the mid-potential Vm is present at the opposite connections by closing the switch 31. All switches are now opened again and the switches 26 and 27 to 29 are then closed. As a result, the upper voltage Vdd is present at the capacitor C8 having the highest capacitance and the lower voltage Vss at the remaining capacitors. If a potential is present at the center line 16 which is higher in comparison to the mid-potential Vm, the comparator 12 responds, the switch 26 is opened again and the switch 30 is closed for the remaining conversion time. The voltage Vdd is now applied to the next lower capacitor C7 (not shown) instead of the voltage Vss. Here, again, it is monitored whether or not the comparator 12 responds. If it does not respond, the voltage Vdd remains applied to this capacitor C7 and the potential Vdd is applied to the next capacitor C6 instead of the potential Vss. In each iteration the comparator 12 is checked for a response, and if it responds, the voltage Vdd is disconnected and the associated switch to Vss is secured, as already explained, for the further conversion time, otherwise the voltage Vdd remains applied to the respective capacitor. After this process has been carried out for all Capacitors C1a to C8, the switch positions of the switches to which the potential Vdd can be applied yield the digital word which corresponds to the analog input voltage Vi. This digital word is passed via the comparator 12 in accordance with the respective steps into the control unit 11 for later output to connected devices.

The precision of the analog-to-digital conversion described is determined in particular by the precision of the capacitance values of the capacitors. Since the desired precision can, in practice, never be achieved with justifiable outlay, a compensation of the tolerances of these capacitors is now carried out. For this purpose, the switch 17 is constantly open since the analog input voltage is not relevant for this process. At first, all capacitors are discharged. This is carried out by closing the switches 18 to 22 and 31 and 32. As a result, the mid-potential Vm is present on both connections of all capacitors. This mid-potential Vm represents the mid-potential between the potentials Vdd and Vss and can be formed for example by a voltage divider. In this process, the precision is of no importance, as will be explained later.

All switches are then opened again and the switches 27 to 29 and 26 are then closed. As a result, the higher voltage Vdd is present at the capacitor C8 having the greatest capacitance and the lower voltage Vss is present at the remaining working capacitors C1a to C7. If all capacitance values were exactly correct, the midpotential Vm exactly would now be present at the center line 16 since the sum of the capacitance values of the capacitors C1a to C7 corresponds to the capacitance of C8. Such an exact charge division could be achieved only in the case of a perfect, binary weighted capacitance arrangement. Each scattering of the capacitance values of the capacitors of the array leads inevitably to a deviation from the ideal mid-potential. This deviation is determined by means of the comparator 12 which compares the potential which appears on the center line 16 with the mid-potential Vm. After a conversion cycle has been carried out completely, a changing signal with a small voltage change, for example ±½ LSB, is superimposed on the mid-potential which has appeared on the center line 16. If a corresponding changing signal is determined at the output of the comparator 12, the present adjustment value is correct. Otherwise the output is at one of the two possible signal levels, as a result of which there is produced via the module 13 a correction signal which is converted in the D/A converter 14 into an analog correction voltage Vk and fed via the closed switch 33 to the correction capacitor Ck. This correction voltage Vk is varied until the adjustment is found. The corresponding correction signal is stored as a digital correction value in a memory 34 of the module 13 as the first provisional correction value.

The switches 27 to 29 and 26 are now opened and the switches 23 to 25 and 30 are closed instead. The voltage Vss is now present at the capacitor C8 as a result and the voltage Vdd at the remaining capacitors. A further corresponding adjustment is then carried out and the determined correction value is stored as the second provisional correction value. If the mid-potential Vm, evaluated as the comparison voltage by the comparator 12, were the exact ideal mid-potential, the two provisional correction values would be identical. In the case of a deviation from the ideal mid-potential, the provisional correction values deviate from each other as well. Now the mean value between the two provisional correction values is formed and this mean value has to be stored as the exact correction value for the highest capacitor C8. In this way, deviations of the voltage Vm from the ideal mid voltage are compensated for automatically.

The procedure previously described is then carried out in a corresponding manner for the remaining working capacitors C1a to C7, so that, in the end, nine correction values are present in the end which are stored in the memory 34 at the address which is associated with the working capacitor to be corrected.

After the calibration has been carried out, the control unit 11, which effects inter alia the switch control in the capacitor array 10, switches the analog-to-digital converter into the operational state "convert". During this state, it functions in the manner described in the introduction. In this process, a recalibration can be requested by means of an internal time control or on demand from outside. Such a recalibration is carried out sequentially, starting with the top bit, but only the recalibration of one capacitor in each case for each request. The conversion cycle is interrupted only briefly in this way. Of course, it is also possible in principle to carry out a complete recalibration cyclically or on request. For the recalibration process, a smoothing algorithm is provided which attenuates significant differences in the respectively found correction value, in a similar manner to a low-pass filter function. This prevents extreme deviations which are formed, for example, by disturbances, affecting the conversion process to a serious degree.

It should also be noted that the invention is, of course, not limited to the calibration or compensation of tolerances of capacitors. A corresponding compensation can also be carried out for other components of an analog-to-digital converter arranged in an array, for example resistors, current sources or the like. For example in the case of resistors, the resistor having the highest conductance corresponds here to the capacitor having the highest capacitance.

For the purpose of additional explanation, the calibration method described is also illustrated in the following text in its mathematical form. The correction voltage Vk, which is formed in the case of an ideal mid-voltage Vm for compensation, is described by the following equation (1):

$$Vk = \frac{Vm}{Ck} \left( \sum_{j=0}^{i-1} \Delta C(j) - \Delta C(i) + Ck \right) \quad (1)$$

Here, C (i) is the capacitance to be calibrated, C (j) are all capacitances with a lower weighting and Ck is the correction capacitance. The prefix here $\Delta$ represents in each case the deviation from the ideal value.

The following equation (2) describes the resulting correction voltage Vk', taking into account a deviation of Vm from the ideal value and with the top capacitance C8 being wired to Vdd and the remaining capacitances to Vss:

$$Vk' = \frac{Vm}{Ck} \left( \sum_{j=0}^{i-1} \Delta C(j) - \Delta C(i) + Ck \right) + \quad (2)$$

$$\left( \sum_{j=0}^{i} (C(j) + \Delta C(j)) + Ck \right) \frac{\Delta Vm}{Ck}$$

The following equation (3) describes the resulting correction voltage Vk" in the case of an inverse wiring of the capacitances (interchange of Vdd and Vss):

$$Vk'' = Vdd - \frac{Vm}{Ck} \left( \sum_{j=0}^{i-1} \Delta C(j) - \Delta C(i) + Ck \right) + \quad (3)$$

$$\left( \sum_{j=0}^{i} + \Delta C(j) \right) + Ck \right) \frac{\Delta Vm}{Ck}$$

The mean value of equations (2) and (3) leads to the correct correction voltage Vk in accordance with equation (4) by means of which the correction capacitor Ck is charged:

$$Vk = \frac{Vk' - Vk''}{2} + \frac{Vdd}{2} \quad (4)$$

As has already been set out, the digital word assigned to this voltage is stored in the memory 34 at the address of the respectively calibrated capacitor. The correction word associated with the respective bit is thus always available. The associated correction voltage is fed in advance during converter operation in the respective bit stage to the correction algorithm which is described by the following equations (5) to (7):

$$V(Reg(i,high)) = -\sum_{j=i}^{n-1} \left( \overline{Bj} \times \left( V(k,j) - \sum_{v=j+1}^{n-1} \left( \frac{Vk(v)}{2^{v-i}} \right) \right) \right) \quad (5)$$

$$V(Reg(i,low)) = \sum_{j=i}^{n-1} \left( Bj \times \left( V(k,j) - \sum_{v=j+1}^{n-1} \left( \frac{Vk(v)}{2^{v-i}} \right) \right) \right) \quad (6)$$

$$V(Corr,i) = \frac{V(Reg(i+1,high)) + V(Reg(i+1,low))}{2} + Vk(i) \quad (7)$$

In this case, V (Reg (i, high)) is the weighted sum of the correction voltages for which the comparator has so far decided with the output level HIGH. This value is stored in an auxiliary register of the module 13. V (Reg (i, low)) is the weighted sum of the correction voltages for which the comparator 12 has so far decided with the output level LOW. This value is stored in a working register, for example in the memory 34. The equivalent digital word is intermediately stored, and when the correction value is identified as being valid, the word is finally stored in the memory 34. V (Corr, i) is the calculated correction voltage for the comparator decision in the case of bit i. n is the number of bits. Bj and $\overline{Bj}$ denote the comparator decision of the bit j.

During the evaluation of Cj, if
the comparator was low: Bj=0 and $\overline{Bj}$=1
the comparator was high: Bj=1 and $\overline{Bj}$=0.

What is claimed is:

1. A method for compensating at least one component tolerance of a plurality of similar components in an analog-to-digital converter, the components being coupled to a common line, an electric value of each component being halved from component to component, a component with a smallest electric value being present twice, comprising the steps of:

(a) applying a first potential to a predetermined component selected from the plurality of components, and a second potential to all of the components whose electric value is less than the electric value of the predetermined component;

(b) comparing, using a comparator, a potential present on the common line to a mid-potential, the mid-potential having an amplitude between the first potential and the second potential;

(c) applying a variable correction voltage, derived from an output of the comparator, to a correction component coupled to the common line;

(d) adjusting the variable correction voltage until the comparator determines the presence of the mid-potential on the common line; and (e) storing a correction value determined from the adjusted variable correction voltage.

2. The method according to claim 1, further comprising the steps of:

repeating steps (a) through (e) interchanging the first and second potentials;

forming a mean value of the correction value produced by the first performance of the method and the correction value produced by the repeated performance; and storing the mean value as the correction value.

3. The method according to claim 1, further comprising the step of repeating steps (a) through (e) for each of the plurality of components and storing a plurality of correction values corresponding respectively to each of the plurality of similar components.

4. The method according to claim 3, further comprising the step of performing a recalibration of at least one of the plurality of correction values during an operational interruption of the analog-to-digital converter.

5. The method according to claim 3, further comprising the step of performing a recalibration of all of the plurality of correction values during a break or on demand.

6. The method according to claim 3, further comprising the step of carrying out a smoothing technique for damping differences in the plurality of correction values, using a low-pass filter.

7. The method according to claim 3, further comprising the step of taking into account each of the plurality of correction values during each step of a conversion performed during normal operation of the analog-to-digital converter.

8. The method according to claim 1, wherein the correction value is stored in digital form.

9. The method according to claim 1, further comprising the steps of sending a changing signal sequence to the comparator for evaluation, determining whether a corresponding output signal change has occurred, and deriving the variable correction voltage from the corresponding output signal change.

10. The method according to claim 1, wherein the plurality of components include at least one first capacitor, and the correction component includes a second capacitor.

11. The method according to claim 10, further comprising the step of discharging the plurality of components and the correction component before determining the correction value.

12. The method according to claim 11, wherein discharge is achieved by connecting both connections of each of the plurality of components to the mid-potential.

* * * * *